(12) United States Patent
Lee et al.

(10) Patent No.: US 11,551,611 B2
(45) Date of Patent: Jan. 10, 2023

(54) PIXEL CIRCUIT AND ORGANIC LIGHT EMITTING DISPLAY DEVICE INCLUDING THE SAME

(71) Applicant: Samsung Display Co., Ltd., Yongin-Si (KR)

(72) Inventors: Sunhee Lee, Seoul (KR); Seryeong Kim, Asan-si (KR); Eunhye Ko, Yongin-si (KR); Eoksu Kim, Seoul (KR); Eunhyun Kim, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/413,617

(22) PCT Filed: Dec. 18, 2018

(86) PCT No.: PCT/KR2019/002581
§ 371 (c)(1),
(2) Date: Jun. 14, 2021

(87) PCT Pub. No.: WO2020/130230
PCT Pub. Date: Jun. 25, 2020

(65) Prior Publication Data
US 2022/0036824 A1  Feb. 3, 2022

(30) Foreign Application Priority Data

Dec. 18, 2018 (KR) .......................... 10-2018-0163858

(51) Int. Cl.
*G09G 3/3233* (2016.01)
*G09G 3/3266* (2016.01)
*G09G 3/3275* (2016.01)

(52) U.S. Cl.
CPC ......... *G09G 3/3233* (2013.01); *G09G 3/3266* (2013.01); *G09G 3/3275* (2013.01); *G09G 2300/0842* (2013.01); *G09G 2310/08* (2013.01)

(58) Field of Classification Search
None
See application file for complete search history.

(56) References Cited

U.S. PATENT DOCUMENTS 9,047,813 B2 * 6/2015 Minami ............... G09G 3/3225
9,818,344 B2   11/2017 Lin et al.
(Continued)

FOREIGN PATENT DOCUMENTS

KR        10-1153349 B1    6/2012
KR   10-2015-0011910 A    2/2015
(Continued)

*Primary Examiner* — Nitin Patel
*Assistant Examiner* — Amen W Bogale
(74) *Attorney, Agent, or Firm* — Innovation Counsel LLP

(57) ABSTRACT

A pixel circuit includes an organic light emitting element, a switching transistor configured to be turned on or off in response to a scan signal, a storage capacitor configured to store a data signal applied through a data line when the switching transistor is turned on, a driving transistor configured to allow a driving current corresponding to the data signal stored in the storage capacitor to flow into the organic light emitting element, and an emission control transistor implemented by an oxide thin film transistor, connected in series to the organic light emitting element and the driving transistor between a high power voltage and a low power voltage, and configured to be turned on or off in response to an emission control signal. The pixel circuit performs a back-biasing operation that compensates for a change in a (Continued)

threshold voltage of the emission control transistor by applying a back-biasing voltage to the emission control transistor.

12 Claims, 9 Drawing Sheets

(56) References Cited

U.S. PATENT DOCUMENTS

| | | | |
|---|---|---|---|
| 2011/0273419 A1* | 11/2011 | Park | G09G 3/3233 |
| | | | 345/76 |
| 2018/0102397 A1* | 4/2018 | Nie | G09G 3/3233 |
| 2018/0166516 A1* | 6/2018 | Chai | H01L 27/32 |
| 2019/0180688 A1* | 6/2019 | Yang | G09G 3/3258 |
| 2019/0180692 A1* | 6/2019 | Fujii | H01L 27/3265 |
| 2020/0135091 A1* | 4/2020 | Kim | G09G 3/32 |
| 2020/0243006 A1* | 7/2020 | Kim | H01L 27/3276 |
| 2020/0258966 A1* | 8/2020 | Cha | H01L 27/3248 |
| 2021/0201790 A1* | 7/2021 | Gai | G09G 3/3233 |
| 2021/0343238 A1* | 11/2021 | Okabe | G09G 3/3275 |

FOREIGN PATENT DOCUMENTS

| | | |
|---|---|---|
| KR | 10-2015-0077710 A | 7/2015 |
| KR | 10-2016-0018892 A | 2/2016 |
| KR | 10-2016-0081709 A | 7/2016 |

\* cited by examiner

PIXEL CIRCUIT AND ORGANIC LIGHT EMITTING DISPLAY DEVICE INCLUDING THE SAME

PRIORITY STATEMENT

This application claims priority to and the benefit of Korean Patent Application No. 10-2018-0163858, filed on Dec. 18, 2018 and PCT Application No PCT/KR2019/002581, filed on Mar. 6, 2019, the entire contents of which are incorporated herein by reference.

BACKGROUND

1. Field

The present inventive concept relates to a display device. More particularly, the present inventive concept relates to a pixel circuit including an organic light emitting element (e.g., an organic light emitting diode), a storage capacitor, and thin film transistors and an organic light emitting display device including the pixel circuit.

2. Description of the Related Art

In general, a pixel circuit included in an organic light emitting display device includes an organic light emitting element, a storage capacitor, and thin film transistors (e.g., a switching transistor, a driving transistor, an emission transistor, and the like). Here, in a conventional pixel circuit, the switching transistor may be implemented as an oxide thin film transistor, the driving transistor may be implemented as an oxide thin film transistor or a low temperature polycrystalline silicon (LTPS) thin film transistor, and the emission control transistor may be implemented as the LTPS thin film transistor having high reliability because the emission control transistor should maintain a turn-on state during a light emitting period.

Recently, a pixel circuit in which all of the thin film transistors are implemented as the oxide thin film transistor has been suggested to be applied to a mobile organic light emitting display device. However, in this pixel circuit, since the emission control transistor is also implemented as the oxide thin film transistor, the emission control transistor may be easily deteriorated as a driving time increases (e.g., a threshold voltage of the emission control transistor increases when the emission control transistor is an n-channel metal oxide semiconductor (NMOS) transistor). As a result, an on-current may decrease during the light emitting period, and thus a current flowing through the organic light emitting element may decrease (i.e., luminance may decrease) even under the same condition.

To solve this problem, a conventional pixel circuit may secure high reliability required for the emission control transistor by increasing a size of the oxide thin film transistor of the emission control transistor. However, as the size of the emission control transistor increases, there may be disadvantages in terms of a layout, and thus there may be a limit in increasing a resolution of the organic light emitting display device.

SUMMARY

One object of the present inventive concept is to provide a pixel circuit that can secure high reliability required for an emission control transistor even when the emission control transistor is implemented by an oxide thin film transistor and has a relatively small size.

Another object of the present inventive concept is to provide an organic light emitting display device including the pixel circuit that can secure high operational reliability and high resolution without increasing a size of an emission control transistor.

However, objects of the present inventive concept are not limited to the above objects and may be variously extended without departing from the spirit and scope of the present inventive concept.

According to embodiments, a pixel circuit may include an organic light emitting element, a switching, a gate electrode of the switching transistor being connected to a scan signal line, a storage capacitor configured to store a data signal, a driving transistor connected between a high power voltage and a low power voltage, the driving transistor being configured to allow a driving current to flow through the organic light emitting element corresponding to the data signal stored in the storage capacitor, and an emission control transistor implemented as an oxide thin film transistor and connected in series to the organic light emitting element and the driving transistor between the high power voltage and the low power voltage. The emission control transistor may include a gate electrode connected to an emission control signal line which is configured to supply an emission control signal and a lower gate electrode connected to a back-biasing voltage line.

In an embodiment, each of the switching transistor and the driving transistor may be implemented as an oxide thin film transistor or a low temperature polycrystalline silicon thin film transistor.

In an embodiment, the back-biasing voltage may be adjusted as a threshold voltage of the emission control transistor shifts greater than or equal to a predetermined value.

In an embodiment, the emission control transistor may be an n-channel metal oxide semiconductor (NMOS) transistor.

In an embodiment, the back-biasing voltage may have a positive voltage level.

In an embodiment, the back-biasing voltage may be the high power voltage.

In an embodiment, the back-biasing voltage may increase as the threshold voltage of the emission control transistor increases.

In an embodiment, the emission control transistor may be a p-channel metal oxide semiconductor (PMOS) transistor.

In an embodiment, the back-biasing voltage may have a negative voltage level.

In an embodiment, the back-biasing voltage may be the low power voltage.

In an embodiment, the back-biasing voltage may decrease as a threshold voltage of the emission control transistor decreases.

According to embodiments, an organic light emitting display device may include a display panel including a plurality of pixel circuits, a data driver configured to provide a data signal to the pixel circuits, a scan driver configured to provide a scan signal to the pixel circuits, an emission control driver configured to provide an emission control signal to the pixel circuits, and a timing controller configured to control the data driver, the scan driver, and the emission control driver. In addition, each of the pixel circuits may include an organic light emitting element, a switching transistor, a gate electrode of the switching transistor being connected a scan signal line, a storage capacitor configured to store the data signal, a driving transistor connected between a high power voltage and a low power voltage, the driving transistor being configured to allow a driving current to flow through the organic light emitting element corresponding to the data signal stored in the storage capacitor, and an emission control transistor implemented as an oxide thin film transistor and connected in series to the organic light emitting element and the driving transistor between the high power voltage and the low power voltage. The emission control transistor may include a gate electrode connected to an emission control signal line configured to supply an emission control signal and a lower gate electrode connected to a back-biasing voltage line.

In an embodiment, each of the switching transistor and the driving transistor may be implemented as an oxide thin film transistor or a low temperature polycrystalline silicon thin film transistor.

In an embodiment, the back-biasing voltage may be adjusted as a threshold voltage of the emission control transistor shifts.

In an embodiment, the emission control transistor may be an n-channel metal oxide semiconductor (NMOS) transistor.

In an embodiment, the back-biasing voltage may have a positive voltage level.

In an embodiment, the back-biasing voltage may increase as the threshold voltage of the emission control transistor increases.

In an embodiment, the emission control transistor may be a p-channel metal oxide semiconductor (PMOS) transistor.

In an embodiment, the back-biasing voltage may have a negative voltage level.

In an embodiment, the back-biasing voltage may decrease as a threshold voltage of the emission control transistor decreases.

According to embodiments, a pixel circuit may include an organic light emitting element, a switching transistor, a gate electrode of the switching transistor being connected to a scan signal line, a storage capacitor configured to store a data signal, a driving transistor connected between a high power voltage and a low power voltage, the driving transistor being configured to allow a driving current to flow through the organic light emitting element corresponding to the data signal stored in the storage capacitor, and an emission control transistor connected in series to the organic light emitting element and the driving transistor. The emission control transistor may include a gate electrode connected to an emission control signal line configured to supply an emission control signal and a lower gate electrode connected to a back-biasing voltage line.

In an embodiment, the emission control transistor may be implemented as an oxide thin film transistor.

A pixel circuit according to embodiments of the present inventive concept may secure high reliability required for an emission control transistor even when the emission control transistor is implemented as an oxide thin film transistor and has a relatively small size by performing a back-biasing operation that compensates for a change in a threshold voltage of the emission control transistor by applying a back-biasing voltage to the emission control transistor that is connected in series to an organic light emitting element and a driving transistor between a high power voltage and a low power voltage (here, the back-biasing voltage applied to the emission control transistor may be adjusted as the threshold voltage of the emission control transistor increases or decreases).

An organic light emitting display device including the pixel circuit according to embodiments of the present inventive concept may secure high operational reliability and high resolution without increasing a size of an emission control transistor.

However, effects of the present inventive concept are not limited to the above effects and may be variously extended without departing from the spirit and scope of the present inventive concept.

DETAILED DESCRIPTION OF THE INVENTIVE CONCEPT

Hereinafter, embodiments of the present inventive concept will be explained in detail with reference to the accompanying drawings.

Figure 1:
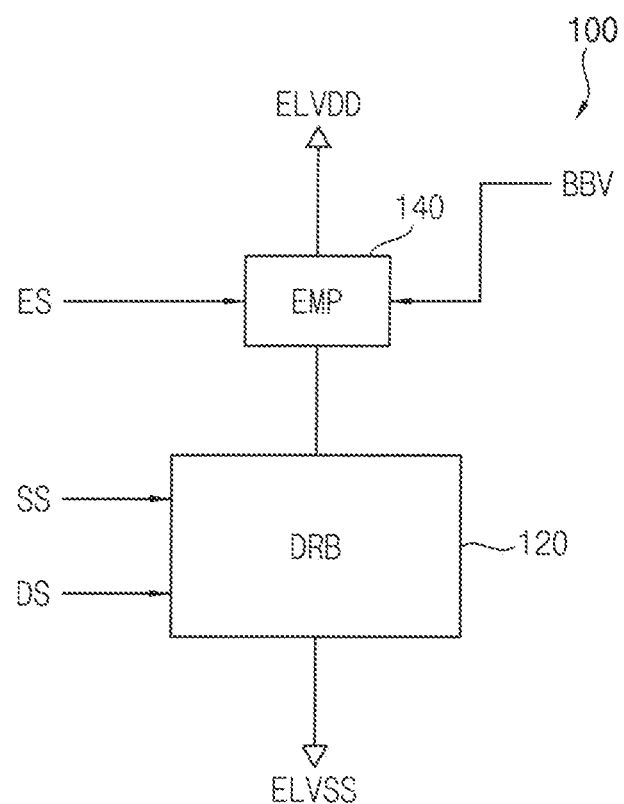
FIG. 1 is a diagram illustrating a pixel circuit according to embodiments.
Figure 2:
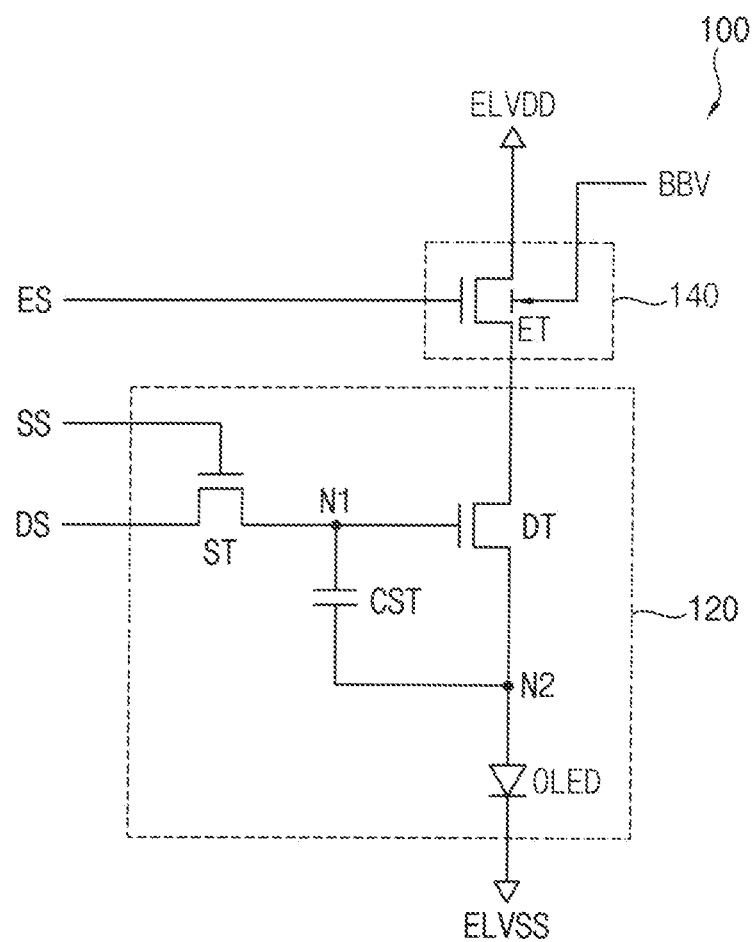
FIG. 2 is a diagram illustrating an example of the pixel circuit of FIG. 1.
Figure 3:
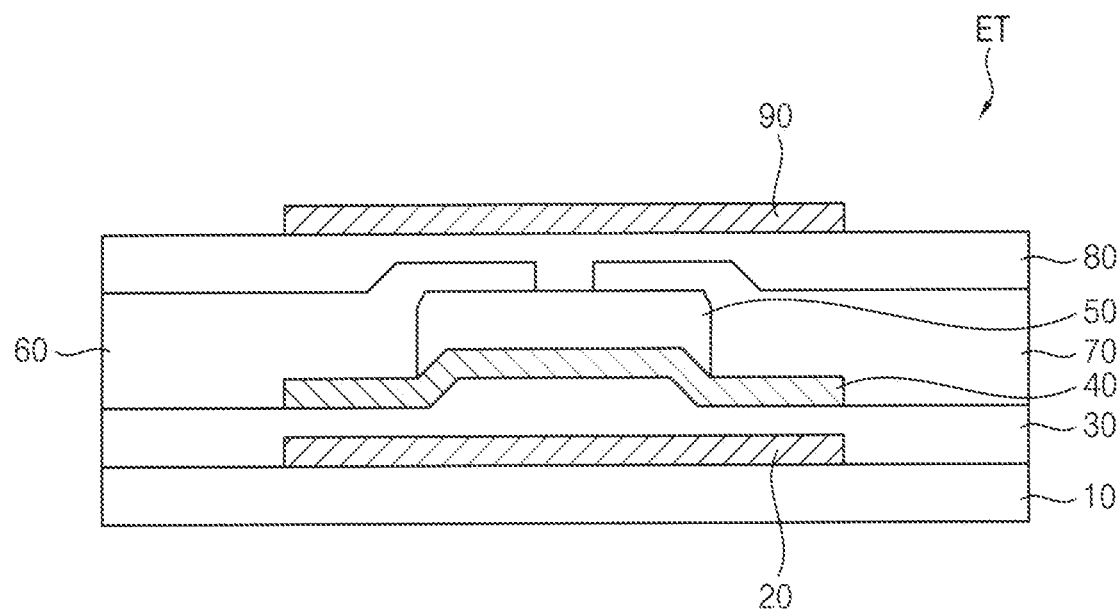
FIG. 3 is a cross-sectional view for describing an example of a structure of an emission control transistor included in the pixel circuit of FIG. 1.

FIG. 1 is a diagram illustrating a pixel circuit according to embodiments, FIG. 2 is a diagram illustrating an example of the pixel circuit of FIG. 1, and FIG. 3 is a cross-sectional view for describing an example of a structure of an emission control transistor included in the pixel circuit of FIG. 1.

Referring to FIGS. 1 to 3, the pixel circuit 100 may include a driving block (DRB) 120 and an emission control block (EMP) 140.

The driving block 120 may receive a data signal DS in response to a scan signal SS and may output light having a luminance corresponding to the data signal DS. To this end, the driving block 120 may include an organic light emitting element OLED, a switching transistor ST, a storage capacitor CST, and a driving transistor DT. The switching transistor ST may be turned on or off in response to the scan signal SS. Here, the switching transistor ST may be implemented as an oxide thin film transistor or a low temperature polycrystalline silicon thin film transistor. The storage capacitor CST may store the data signal DS applied through a data line when the switching transistor ST is turned on. The driving transistor DT may allow a driving current corresponding to the data signal DS stored in the storage capacitor CST to flow through the organic light emitting element OLED. Here, the driving transistor DT may be implemented as an oxide thin film transistor or a low temperature polycrystalline silicon thin film transistor. The organic light emitting element OLED may output light having a luminance corresponding to the driving current. Here, the organic light emitting element OLED may be an organic light emitting diode but the organic light emitting element OLED is not limited to the organic light emitting diode.

The emission control block 140 may control a time period of light emission by the pixel circuit 100. To this end, the emission control block 140 may include an emission control transistor ET. The emission control transistor ET may be implemented as an oxide thin film transistor, may be connected in series to the organic light emitting element OLED and the driving transistor DT which are included in the driving block 120 between a high power voltage ELVDD and a low power voltage ELVSS, and may be turned on or off in response to an emission control signal ES. Accordingly, the pixel circuit 100 may allow the organic light emitting element OLED to emit light during a light emitting period in which the emission control transistor ET is turned on and may allow the organic light emitting element OLED not to emit light during a light non-emitting period in which the emission control transistor ET is turned off (i.e., may prepare light emission of the organic light emitting element OLED). As described above, since the emission control transistor ET is implemented as an oxide thin film transistor, a characteristic change of the emission control transistor ET according to a driving time of the emission control transistor ET (e.g., a change in a threshold voltage of the emission control transistor ET) may be relatively large as compared to a case when the emission control transistor ET is implemented as a low temperature polycrystalline silicon thin film transistor. To solve this problem, the pixel circuit 100 may perform a back-biasing operation that compensates for the change in the threshold voltage of the emission control transistor ET by applying a back-biasing voltage BBV to the emission control transistor ET. This will be described in detail below.

In an embodiment, as illustrated in FIG. 2, the pixel circuit 100 may have a 3T-1C structure (i.e., a structure including three transistors ST, DT, and ET and one storage capacitor CST), and all three transistors ST, DT, and ET may be implemented as an NMOS transistor. Specifically, the driving block 120 may include the organic light emitting element OLED, the switching transistor ST, the storage capacitor CST, and the driving transistor DT, and the emission control block 140 may include the emission control transistor ET. The organic light emitting element OLED may include an anode connected to a second node N2 and a cathode to which the low power voltage ELVSS is applied. The switching transistor ST may include a first electrode to which the data signal DS is applied, a second electrode connected to a first node N1, and a gate electrode to which the scan signal SS is applied. The storage capacitor CST may include a first electrode connected to the first node N1 and a second electrode connected to the second node N2. The driving transistor DT may include a first electrode connected to the second electrode of the emission control transistor ET, a second electrode connected to the second node N2, and a gate electrode connected to the first node N1. The emission control transistor ET may include a first electrode to which the high power voltage ELVDD is applied, a second electrode connected to the first electrode of the driving transistor DT, an upper gate electrode to which the emission control signal ES is applied, and a lower gate electrode to which the back-biasing voltage BBV is applied.

Although it is described in FIG. 2 that the pixel circuit 100 includes the organic light emitting element OLED, the switching transistor ST, the storage capacitor CST, the driving transistor DT, and the emission control transistor ET, it should be understood that the organic light emitting element OLED, the switching transistor ST, the storage capacitor CST, the driving transistor DT, and the emission control transistor ET are just mentioned as essential components of the pixel circuit 100. In other words, the pixel circuit 100 may further include other components in addition to the organic light emitting element OLED, the switching transistor ST, the storage capacitor CST, the driving transistor DT, and the emission control transistor ET. For example, the pixel circuit 100 may further include components for compensating for a threshold voltage of the driving transistor DT (e.g., external compensation or internal compensation) and/or components for initializing the first and second nodes N1 and N2. In addition, a connection structure among the components of the pixel circuit 100 shown in FIG. 2 (i.e., the organic light emitting element OLED, the switching transistor ST, the storage capacitor CST, the driving transistor DT, and the emission control transistor ET) is an example. Thus, the connection structure among the components of the pixel circuit 100 may be variously changed. For example, when the pixel circuit 100 further includes the components for compensating for the threshold voltage of the driving transistor DT and/or the components for initializing the first and second nodes N1 and N2, the connection structure among the components of the pixel circuit 100 may be changed to form a connection with the added components (i.e., the components for compensating for the threshold voltage of the driving transistor DT and/or the components for initializing the first and second nodes N1 and N2).

As described above, the pixel circuit 100 may perform the back-biasing operation that compensates for the change in the threshold voltage of the emission control transistor ET by applying the back-biasing voltage BBV to the emission control transistor ET. To this end, the emission control transistor ET may additionally include the lower gate electrode to which the back-biasing voltage BBV is applied. For example, the emission control transistor ET may have a cross-sectional structure shown in FIG. 3. Specifically, the emission control transistor ET may have the cross-sectional structure in which a substrate 10, the lower gate electrode 20, a gate insulating layer 30, an active layer 40, an etch stopper layer 150, the first and second electrodes 60 and 70, a gate insulating layer 80, and the upper gate electrode 90 are sequentially disposed (or disposed). The substrate 10 may be a silicon semiconductor substrate, a glass substrate, a plastic substrate, or the like. The lower gate electrode 20 may be formed on the substrate 10. For example, the lower gate electrode 20 may be formed by depositing a conductive layer such as a metal on the substrate 10 and by patterning the deposited metal. The gate insulating layer 30 may be formed on the lower gate electrode 20 to cover the lower gate electrode 20. The active layer 40 may be formed on the gate insulating layer 30. The active layer 40 may provide a channel region, a source region, and a drain region. The active region disposed between the source region and the drain region may be a channel region. The channel region may be completely overlapped with the lower gate electrode 20. The etch stopper layer 50 may be formed on the active layer 40 and may cover a partial region of the active layer 40. The first electrode 60 and the second electrode 70 may be formed on the etch stopper layer 50 and may contact the source region and the drain region (i.e., exposed regions of the active layer 40), respectively. The gate insulating layer 80 may be formed on the etch stopper layer 50 and the first electrode 60 and the second electrode 70 while covering the etch stopper layer 50 and the first electrode 60 and the second electrode 70. The upper gate electrode 90 may be formed on the gate insulating layer 80. For example, the upper gate electrode 90 may be formed by depositing a conductive layer such as a metal on the gate insulating layer 80 and by patterning the deposited metal. The cross-sectional structure shown in FIG. 3 is an example and the emission control transistor ET may have various cross-sectional structures.

In general, when an oxide thin film transistor is an NMOS transistor and when a threshold voltage of the oxide thin film transistor increases (i.e., moves in a positive direction), an on-current of the oxide thin film transistor may decrease under the same condition when the same gate voltage is applied to the gate electrode of the oxide thin film transistor. Here, when the back-biasing voltage BBV having a positive voltage level is applied to the oxide thin film transistor, an effect of decreasing the threshold voltage of the oxide thin film transistor (i.e., an effect of moving the threshold voltage of the oxide thin film transistor in a negative direction) may occur, and thus the on-current of the oxide thin film transistor may not be reduced under the same condition. In addition, when an oxide thin film transistor is a PMOS transistor and when a threshold voltage of the oxide thin film transistor decreases (i.e., moves in a negative direction), an on-current of the oxide thin film transistor may decrease under the same condition. Here, when the back-biasing voltage BBV having a negative voltage level is applied to the oxide thin film transistor, an effect of increasing the threshold voltage of the oxide thin film transistor (i.e., an effect of moving the threshold voltage of the oxide thin film transistor in a positive direction) may occur, and thus the on-current of the oxide thin film transistor may not be reduced under the same condition. Although it is described above that the emission control transistor ET is implemented as an oxide thin film transistor, and the switching transistor ST and the driving transistor DT are implemented as the oxide thin film transistor or a low temperature polycrystalline silicon thin film transistor in the pixel circuit 100, it is preferable that the emission control transistor ET, the switching transistor ST, and the driving transistor DT are all implemented as an oxide thin film transistor to simplify a manufacturing process of the pixel circuit 100.

As described above, because the emission control transistor ET in the pixel circuit 100 is implemented as an oxide thin film transistor having relatively low reliability (i.e., the characteristic change according to the driving time of the emission control transistor ET is relatively large), the pixel circuit 100 may compensate for the change in the threshold voltage of the emission control transistor ET by applying the back-biasing voltage BBV to a lower metal layer (i.e., the lower gate electrode 20) formed in the emission control transistor ET in order to secure high reliability of the emission control transistor ET without increasing a size of the emission control transistor ET. Here, when the threshold voltage of the emission control transistor ET increases or decreases as the driving time of the emission control transistor ET increases, the back-biasing voltage BBV applied to the emission control transistor ET may be adjusted accordingly. In an embodiment, as illustrated in FIG. 2, the emission control transistor ET may be an NMOS transistor. In this case, the back-biasing voltage BBV may have a positive voltage level. In some embodiments, the back-biasing voltage BBV may be a constant voltage having a positive voltage level which is externally applied or the high power voltage ELVDD. In this case, the threshold voltage of the emission control transistor ET may increase (i.e., move in a positive direction) as the driving time of the emission control transistor ET increases and the back-biasing voltage BBV applied to the emission control transistor ET may increase (i.e., move in a positive direction) as the threshold voltage of the emission control transistor ET increases. In another embodiment, the emission control transistor ET may be a PMOS transistor. In this case, the back-biasing voltage BBV may have a negative voltage level. In some embodiments, the back-biasing voltage BBV may be a constant voltage having a negative voltage level which is externally applied or the low power voltage ELVSS. In this case, the threshold voltage of the emission control transistor ET may decrease (i.e., move in a negative direction) as the driving time of the emission control transistor ET increases and the back-biasing voltage BBV applied to the emission control transistor ET may decrease (i.e., move in a negative direction) as the threshold voltage of the emission control transistor ET decreases.

In brief, the pixel circuit 100 may sufficiently secure high reliability required for the emission control transistor ET even when the emission control transistor ET is implemented as an oxide thin film transistor and has a relatively small size by performing the back-biasing operation that compensates for the change in the threshold voltage of the emission control transistor ET by applying the back-biasing voltage BBV to the emission control transistor ET that is connected in series to the organic light emitting element OLED and the driving transistor DT between the high power voltage ELVDD and the low power voltage ELVSS (here, the back-biasing voltage BBV applied to the emission control transistor ET may be adjusted as the threshold voltage of the emission control transistor ET increases or decreases). Thus, an organic light emitting display device including the pixel circuit 100 may secure high operational reliability and high resolution without increasing the size of the emission control transistor ET. Although it is illustrated in FIG. 2 that the switching transistor ST, the driving transistor DT, and the emission control transistor ET are implemented as an NMOS transistor, the switching transistor ST, the driving transistor DT, and the emission control transistor ET may be implemented by a PMOS transistor or by combination of the NMOS transistor and the PMOS transistor according to requirements.

Figure 4:
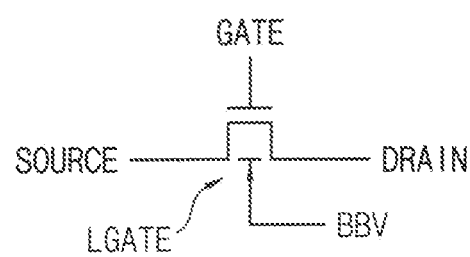
FIG. 4 is a diagram illustrating an example of an emission control transistor included in the pixel circuit of FIG. 1.
Figure 5:
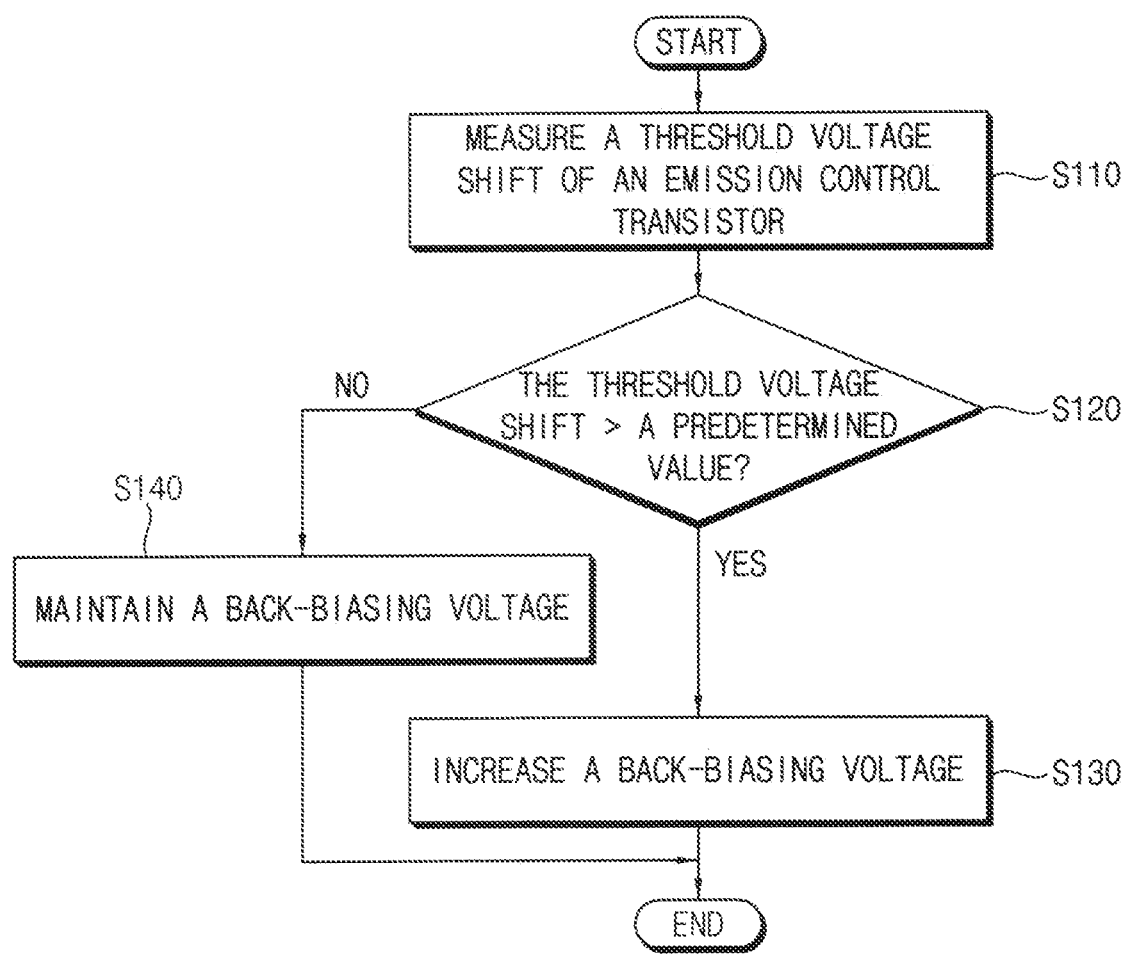
FIG. 5 is a flowchart illustrating a method of adjusting a back-biasing voltage applied to the emission control transistor of FIG. 2.

FIG. 4 is a diagram illustrating an example of an emission control transistor included in the pixel circuit of FIG. 1, and FIG. 5 is a flowchart illustrating a method of adjusting a back-biasing voltage applied to the emission control transistor of FIG. 2.

Referring to FIGS. 4 and 5, the emission control transistor ET may be an NMOS transistor. The emission control transistor ET may include a source electrode SOURCE, a drain electrode DRAIN, an upper gate electrode GATE, and a lower gate electrode (LGATE). The back-biasing voltage BBV may be applied to the lower gate electrode of the emission control transistor ET (i.e., the lower metal layer). When the emission control transistor ET is an NMOS, the emission control transistor ET may be turned on when the emission control signal ES applied to the upper gate electrode GATE of the emission control transistor ET has a positive voltage level greater than a threshold voltage of the emission control transistor ET, a channel formed inside the emission control transistor ET may be an n-channel, and the threshold voltage of the emission control transistor ET may shift to the a positive direction as the driving time of the emission control transistor ET increases. Thus, the back-biasing voltage BBV applied to the lower gate electrode of the emission control transistor ET may have a positive voltage level. In an embodiment, the back-biasing voltage BBV may be a constant voltage having a positive voltage level which is externally applied. In another embodiment, the back-biasing voltage BBV may be a high power voltage ELVDD having a positive voltage level. As illustrated in FIG. 5, the pixel circuit 100 may measure the threshold voltage of the emission control transistor ET (S110) (e.g., in a way of estimating the threshold voltage of the emission control transistor ET by checking an accumulated driving time of the emission control transistor ET or in a way of sensing the threshold voltage of the emission control transistor ET using an external sensing circuit) and may determine whether the threshold voltage shift of the emission control transistor ET to a positive direction is greater than or equal to a predetermined value (S120). Here, when the threshold voltage shift of the emission control transistor ET is greater than or equal to the predetermined value, the pixel circuit 100 may increase the back-biasing voltage BBV applied to the emission control transistor ET (i.e., move the back-biasing voltage BBV applied to the emission control transistor ET in a positive direction) (S130). On the other hand, when the threshold voltage shift of the emission control transistor ET is less than the predetermined value, the pixel circuit 100 may maintain the back-biasing voltage BBV applied to the emission control transistor ET (S140).

Figure 6:
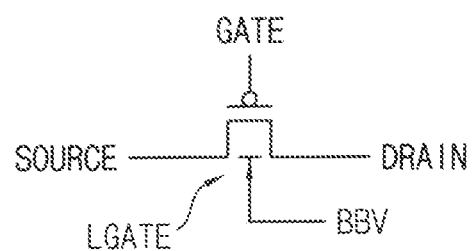
FIG. 6 is a diagram illustrating another example of an emission control transistor included in the pixel circuit of FIG. 1.
Figure 7:
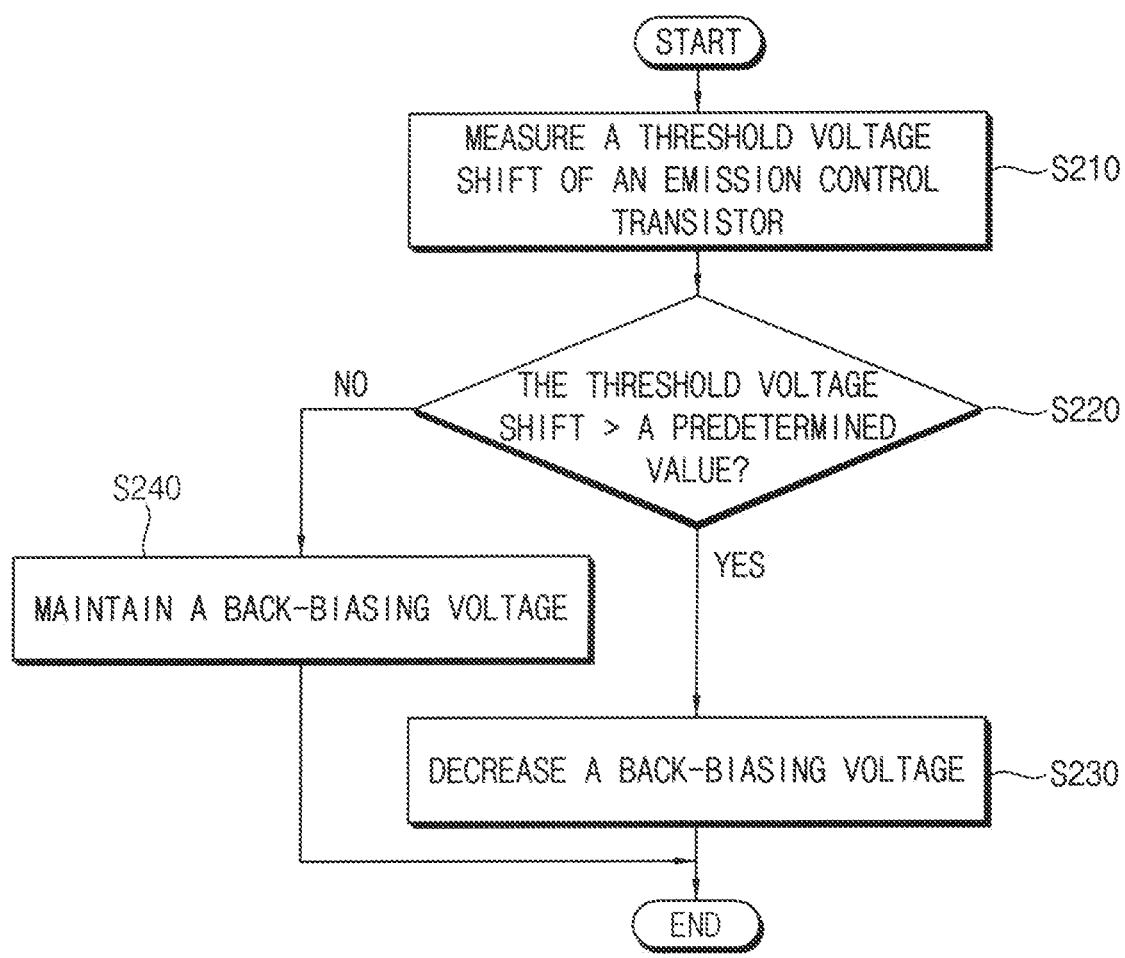
FIG. 7 is a flowchart illustrating a method of adjusting a back-biasing voltage applied to the emission control transistor of FIG. 6.

FIG. 6 is a diagram illustrating another example of an emission control transistor included in the pixel circuit of FIG. 1, and FIG. 7 is a flowchart illustrating a method of adjusting a back-biasing voltage applied to the emission control transistor of FIG. 6.

Referring to FIGS. 6 and 7, the emission control transistor ET may be a PMOS transistor. The emission control transistor ET may include a source electrode SOURCE, a drain electrode DRAIN, an upper gate electrode GATE, and a lower gate electrode (LGATE). The back-biasing voltage BBV may be applied to the lower gate electrode of the emission control transistor ET (i.e., the lower metal layer). In this case, the emission control transistor ET may be turned on when the emission control signal ES applied to the upper gate electrode GATE of the emission control transistor ET has a negative voltage level less than a threshold voltage of the emission control transistor ET, a channel formed inside the emission control transistor ET may be a p-channel, and the threshold voltage of the emission control transistor ET may shift to a negative direction as the driving time of the emission control transistor ET increases. Thus, the back-biasing voltage BBV applied to the lower gate electrode of the emission control transistor ET may have a negative voltage level. In an embodiment, the back-biasing voltage BBV may be a constant voltage having a negative voltage level which is externally applied. In another embodiment, the back-biasing voltage BBV may be a low power voltage ELVSS having a negative voltage level. As illustrated in FIG. 7, the pixel circuit 100 may measure the threshold voltage of the emission control transistor ET (S210) (e.g., in a way of estimating the threshold voltage of the emission control transistor ET by checking an accumulated driving time of the emission control transistor ET or in a way of sensing the threshold voltage of the emission control transistor ET using an external sensing circuit) and may determine whether the threshold voltage shift of the emission control transistor ET to a negative direction is greater than or equal to a predetermined value (S220). Here, when the threshold voltage shift of the emission control transistor ET is greater than or equal to the predetermined value, the pixel circuit 100 may decrease the back-biasing voltage BBV applied to the emission control transistor ET (i.e., move the back-biasing voltage BBV applied to the emission control transistor ET in a negative direction) (S230). On the other hand, when the threshold voltage shift of the emission control transistor ET is less than the predetermined value, the pixel circuit 100 may maintain the back-biasing voltage BBV applied to the emission control transistor ET (S240).

Figure 8:
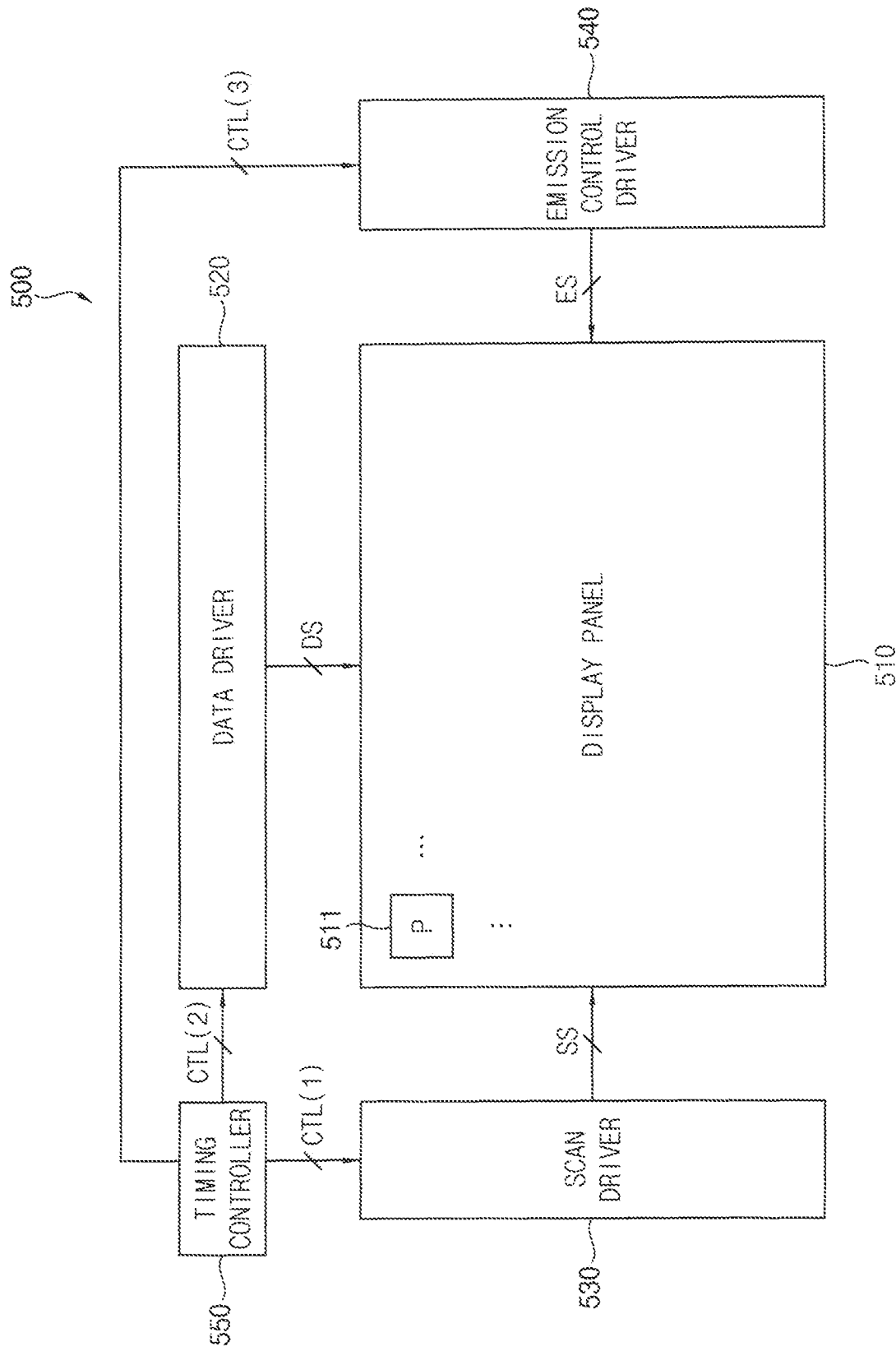
FIG. 8 is a block diagram illustrating an organic light emitting display device according to embodiments.

FIG. 8 is a block diagram illustrating an organic light emitting display device according to embodiments.

Referring to FIG. 8, the organic light emitting display device 500 may include a display panel 510, a data driver 520, a scan driver 530, an emission control driver 540, and a timing controller 550.

The display panel 510 may include a plurality of pixel circuits 511. The display panel 510 may be connected to the data driver 520 through data lines, connected to the scan driver 530 through scan lines, and connected to the emission control driver 540 through emission control lines. The data driver 520 may provide a data signal DS to the display panel 510 through the data lines. That is, the data driver 520 may provide the data signal DS to the pixel circuits 511. The scan driver 530 may provide a scan signal SS to the display panel 510 through the scan lines. That is, the scan driver 530 may provide the scan signal SS to the pixel circuits 511. The emission control driver 540 may provide an emission control signal ES to the display panel 510 through the emission control lines. That is, the emission control driver 540 may provide the emission control signal ES to the pixel circuits 511. The timing controller 550 may generate a plurality of control signals CTL(1), CTL(2), and CTL(3) and may provide the control signals CTL(1), CTL(2), and CTL(3) to the scan driver 530, the data driver 520, and the emission control driver 540, respectively. That is, the timing controller 550 may control the scan driver 530, the data driver 520, and the emission control driver 540. In some embodiments, the timing controller 550 may receive image data, may perform a specific data processing on the image data (e.g., deterioration compensation and the like) and provide it to the data driver 520, and may provide the processed image data to the data driver 520.

In embodiments, the pixel circuit 511 included in the display panel 510 may include an emission control transistor that is implemented by an oxide thin film transistor and connected in series to an organic light emitting element and a driving transistor between a high power voltage and a low power voltage. Here, because the emission control transistor in the pixel circuit 511 is implemented by an oxide thin film transistor and has a relatively large characteristic change (e.g., a change in a threshold voltage of the emission control transistor) according to the driving time of the emission control transistor, the pixel circuit 511 may not secure high reliability generally required for the emission control transistor. Accordingly, the pixel circuit 511 may perform a back-biasing operation that compensates for the change in the threshold voltage of the emission control transistor by applying a back-biasing voltage to the emission control transistor. As a result, the pixel circuit 511 may secure high reliability required for the emission control transistor even when the emission control transistor is implemented by an oxide thin film transistor and has a relatively small size. To this end, the pixel circuit 511 may include an organic light emitting element, a switching transistor that is turned on or off in response to the scan signal SS, a storage capacitor that stores the data signal DS applied through the data line when the switching transistor is turned on, a driving transistor that allows a driving current corresponding to the data signal DS stored in the storage capacitor to flow into the organic light emitting element, and the emission control transistor that is turned on or off in response to the emission control signal ES. As described above, the pixel circuit 511 may perform the back-biasing operation that compensates for the change in the threshold voltage of the emission control transistor by applying the back-biasing voltage to the emission control transistor. In some embodiments, each of the switching transistor and the driving transistor included in the pixel circuit 511 may be implemented by an oxide thin film transistor or a low temperature polycrystalline silicon thin film transistor. However, like the emission control transistor, it is preferable that each of the switching transistor and the driving transistor is implemented by an oxide thin film transistor to simplify a manufacturing process of the pixel circuit 511.

When the pixel circuit 511 performs the back-biasing operation that compensates for the change in the threshold voltage of the emission control transistor by applying the back-biasing voltage to the emission control transistor, the back-biasing voltage applied to the emission control transistor may be adjusted as the threshold voltage of the emission control transistor shifts (increases or decreases). In an embodiment, the emission control transistor may be an NMOS transistor. Here, the back-biasing voltage applied to the emission control transistor may have a positive voltage level. In this case, the threshold voltage of the emission control transistor may increase as the driving time of the emission control transistor increases, and the back-biasing voltage applied to the emission control transistor may increase as the threshold voltage of the emission control transistor increases. In another embodiment, the emission control transistor may be a PMOS transistor. Here, the back-biasing voltage applied to the emission control transistor may have a negative voltage level. In this case, the threshold voltage of the emission control transistor may decrease as the driving time of the emission control transistor increases, and the back-biasing voltage applied to the emission control transistor may decrease as the threshold voltage of the emission control transistor decreases. Since these operations are described above with reference to FIGS. 1 to 7, duplicated description related thereto will not be repeated. In brief, the pixel circuit 511 may secure high reliability required for the emission control transistor even when the emission control transistor is implemented by an oxide thin film transistor and has a relatively small size by performing the back-biasing operation that compensates for the threshold voltage shift of the emission control transistor by applying the back-biasing voltage to the emission control transistor. Thus, the organic light emitting display device 500 including the pixel circuit 511 may secure high operational reliability and high resolution without increasing a size of the emission control transistor.

Figure 9:
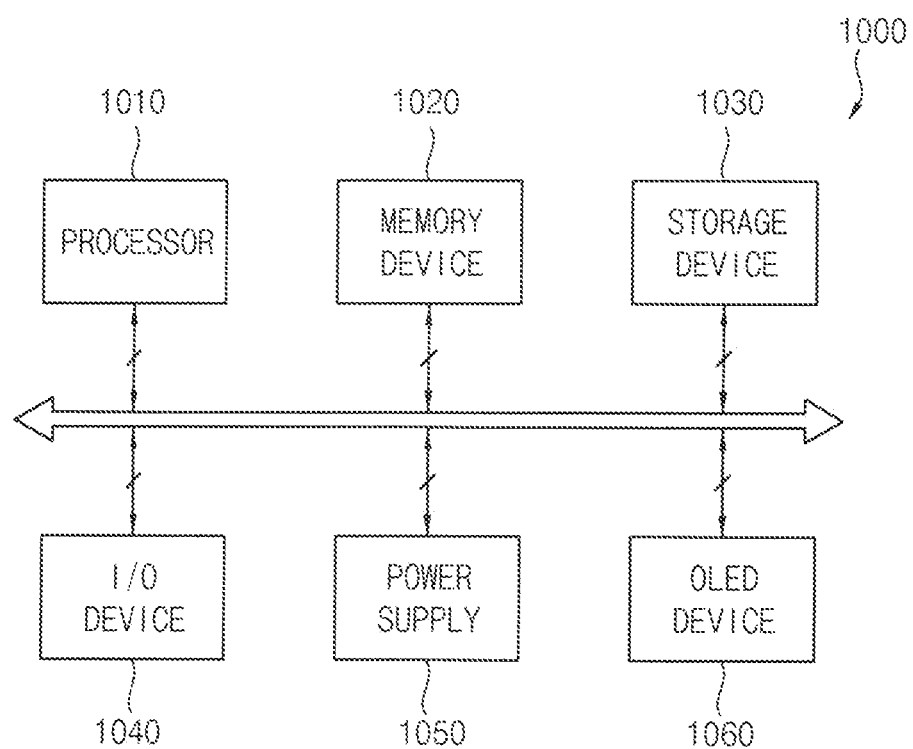
FIG. 9 is a block diagram illustrating an electronic device according to embodiments.
Figure 10:
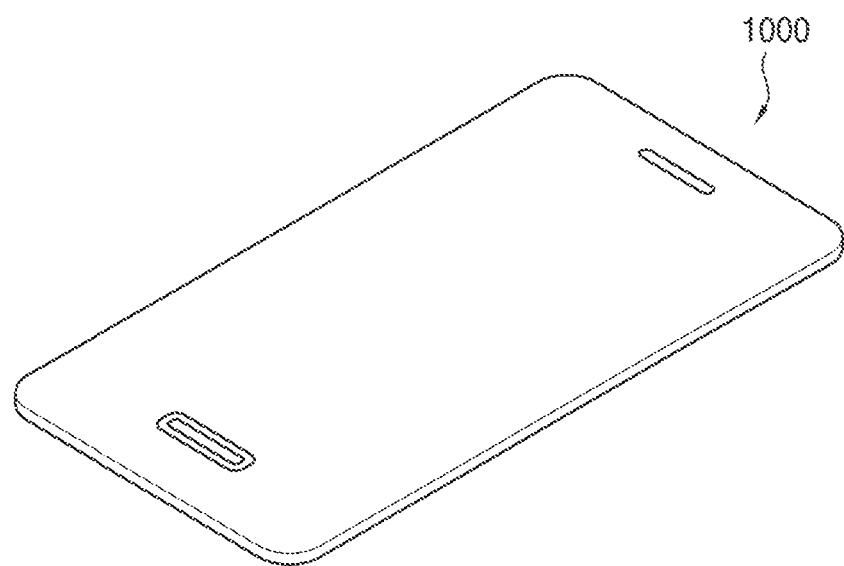
FIG. 10 is a diagram illustrating an example in which the electronic device of FIG. 9 is implemented as a smart phone.

FIG. 9 is a block diagram illustrating an electronic device according to embodiments, and FIG. 10 is a diagram illustrating an example in which the electronic device of FIG. 9 is implemented as a smart phone.

Referring to FIGS. 9 and 10, the electronic device 1000 may include a processor 1010, a memory device 1020, a storage device 1030, an input/output (I/O) device 1040, a power supply 1050, and an organic light emitting display device 1060. Here, the organic light emitting display device 1060 may be the organic light emitting display device 500 of FIG. 8. In addition, the electronic device 1000 may further include a plurality of ports for communicating with a video card, a sound card, a memory card, a universal serial bus (USB) device, other electronic devices, and the like. In an embodiment, as illustrated in FIG. 10, the electronic device 1000 may be implemented as a smart phone. However, the electronic device 1000 is not limited thereto. For example, the electronic device 1000 may be implemented as a cellular phone, a video phone, a smart pad, a smart watch, a tablet PC, a car navigation system, a computer monitor, a laptop, a head mounted display (HMD) device, and the like.

The processor 1010 may perform various computing functions. The processor 1010 may be a micro-processor, a central processing unit (CPU), an application processor (AP), and the like. The processor 1010 may be coupled to other components via an address bus, a control bus, a data bus, and the like. Further, the processor 1010 may be coupled to an extended bus such as a peripheral component interconnection (PCI) bus. The memory device 1020 may store data for operations of the electronic device 1000. For example, the memory device 1020 may include a non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, and the like and/or a volatile memory device such as a dynamic random access memory (DRAM) device, a static random access memory (SRAM) device, a mobile DRAM device, and the like. The storage device 1030 may include a solid state drive (SSD) device, a hard disk drive (HDD) device, a CD-ROM device, and the like. The I/O device 1040 may include an input device such as a keyboard, a keypad, a mouse device, a touch-pad, a touch-screen, and the like and an output device such as a printer, a speaker, and the like. In some embodiments, the organic light emitting display device 1060 may be included in the I/O device 1040. The power supply 1050 may provide power for operations of the electronic device 1000. The organic light emitting display device 1060 may be coupled to other components via the buses or other communication links.

As described above, the organic light emitting display device 1060 may include a pixel circuit that performs a back-biasing operation that compensates for a change in a threshold voltage of an emission control transistor by applying a back-biasing voltage to the emission control transistor that is connected in series to an organic light emitting element and a driving transistor between a high power voltage and a low power voltage. Thus, the organic light emitting display device 1060 may secure high operational reliability and high resolution without increasing a size of the emission control transistor. To this end, the organic light emitting display device 1060 may include a display panel including pixel circuits, a data driver that provide a data signal to the pixel circuits, a scan driver that provide a scan signal to the pixel circuits, an emission control driver that provide an emission control signal to the pixel circuits, and a timing controller that controls the data driver, the scan driver, and the emission control driver. In addition, each of the pixel circuits may include an organic light emitting element, a switching transistor that is turned on or off in response to the scan signal, a storage capacitor that stores the data signal applied through a data line when the switching transistor is turned on, a driving transistor that allows a driving current corresponding to the data signal stored in the storage capacitor to flow through the organic light emitting element, and an emission control transistor that is turned on or off in response to the emission control signal, where the emission control transistor is implemented by an oxide thin film transistor and connected in series to the organic light emitting element and the driving transistor between the high power voltage and the low power voltage. Here, each of the pixel circuits may perform the back-biasing operation that compensates for the threshold voltage shift of the emission control transistor by applying the back-biasing voltage to the emission control transistor (here, the back-biasing voltage applied to the emission control transistor may be adjusted as the threshold voltage of the emission control transistor increases or decreases). Thus, even when the emission control transistor is implemented by the oxide thin film transistor and has a relatively small size, each of the pixel circuits may secure high reliability required for the emission control transistor. However, since these are described above, duplicated description related thereto will not be repeated.

The present inventive concept may be applied to an organic light emitting display device and an electronic device including the organic light emitting display device. For example, the present inventive concept may be applied to a cellular phone, a smart phone, a video phone, a smart pad, a smart watch, a tablet PC, a car navigation system, a television, a computer monitor, a laptop, a head mounted display (HMD) apparatus, an MP3 player, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

The invention claimed is:

1. A pixel circuit comprising:
an organic light emitting element;
a switching transistor, a gate electrode of the switching transistor being connected to a scan signal line;
a storage capacitor configured to store a data signal;
a driving transistor connected between a high power voltage and a low power voltage, the driving transistor being configured to allow a driving current to flow through the organic light emitting element corresponding to the data signal stored in the storage capacitor; and
an emission control transistor implemented as an oxide thin film transistor and connected in series to the organic light emitting element and the driving transistor between the high power voltage and the low power voltage, the emission control transistor including:
a gate electrode connected to an emission control signal line which is configured to supply an emission control signal, and
a lower gate electrode connected to a back-biasing voltage line,
wherein the emission control transistor is an n-channel metal oxide semiconductor (NMOS) transistor, and
wherein a back-biasing voltage is the high power voltage.

2. The pixel circuit of claim 1, wherein each of the switching transistor and the driving transistor is implemented as an oxide thin film transistor or a low temperature polycrystalline silicon thin film transistor.

3. The pixel circuit of claim 1, wherein the back-biasing voltage which is applied to the back-biasing voltage line is adjusted as a threshold voltage of the emission control transistor shifts greater than or equal to a predetermined value.

4. The pixel circuit of claim 3, wherein the back-biasing voltage increases as the threshold voltage of the emission control transistor increases.

5. A pixel circuit comprising:
an organic light emitting element;
a switching transistor, a gate electrode of the switching transistor being connected to a scan signal line;
a storage capacitor configured to store a data signal;
a driving transistor connected between a high power voltage and a low power voltage, the driving transistor being configured to allow a driving current to flow through the organic light emitting element corresponding to the data signal stored in the storage capacitor; and
an emission control transistor implemented as an oxide thin film transistor and connected in series to the organic light emitting element and the driving transistor between the high power voltage and the low power voltage, the emission control transistor including:
a gate electrode connected to an emission control signal line which is configured to supply an emission control signal, and
a lower gate electrode connected to a back-biasing voltage line,
wherein the emission control transistor is a p-channel metal oxide semiconductor (PMOS) transistor, and
wherein a back-biasing voltage is the low power voltage.

6. The pixel circuit of claim 5, wherein the back-biasing voltage decreases as a threshold voltage of the emission control transistor decreases.

7. An organic light emitting display device comprising:
a display panel including a plurality of pixel circuits;
a data driver configured to provide a data signal to the pixel circuits;
a scan driver configured to provide a scan signal to the pixel circuits;
an emission control driver configured to provide an emission control signal to the pixel circuits; and
a timing controller configured to control the data driver, the scan driver, and the emission control driver,
wherein each of the pixel circuits comprises:
an organic light emitting element;
a switching transistor, a gate electrode of the switching transistor being connected a scan signal line;
a storage capacitor configured to store the data signal;
a driving transistor connected between a high power voltage and a low power voltage, the driving transistor being configured to allow a driving current to flow through the organic light emitting element corresponding to the data signal stored in the storage capacitor; and
an emission control transistor implemented as an oxide thin film transistor and connected in series to the organic light emitting element and the driving transistor between the high power voltage and the low power voltage, the emission control transistor including:
a gate electrode connected to an emission control signal line configured to supply an emission control signal, and
a lower gate electrode connected to a back-biasing voltage line, wherein the emission control transistor is an n-channel metal oxide semiconductor (NMOS) transistor, and
wherein a back-biasing voltage is the high power voltage.

8. The organic light emitting display device of claim 7, wherein each of the switching transistor and the driving transistor is implemented as an oxide thin film transistor or a low temperature polycrystalline silicon thin film transistor.

9. The organic light emitting display device of claim 7, wherein the back-biasing voltage which is applied to the back-biasing voltage line is adjusted as a threshold voltage of the emission control transistor shifts.

10. The organic light emitting display device of claim 9, wherein the back-biasing voltage increases as the threshold voltage of the emission control transistor increases.

11. An organic light emitting display device comprising:
a display panel including a plurality of pixel circuits;
a data driver configured to provide a data signal to the pixel circuits;
a scan driver configured to provide a scan signal to the pixel circuits;
an emission control driver configured to provide an emission control signal to the pixel circuits; and
a timing controller configured to control the data driver, the scan driver, and the emission control driver,
wherein each of the pixel circuits comprises:
an organic light emitting element;
a switching transistor, a gate electrode of the switching transistor being connected a scan signal line;
a storage capacitor configured to store the data signal;
a driving transistor connected between a high power voltage and a low power voltage, the driving transistor being configured to allow a driving current to flow through the organic light emitting element corresponding to the data signal stored in the storage capacitor; and
an emission control transistor implemented as an oxide thin film transistor and connected in series to the organic light emitting element and the driving transistor between the high power voltage and the low power voltage, the emission control transistor including:
a gate electrode connected to an emission control signal line configured to supply an emission control signal, and
a lower gate electrode connected to a back-biasing voltage line,
wherein the emission control transistor is a p-channel metal oxide semiconductor (PMOS) transistor, and
wherein a back-biasing voltage is the low power voltage.

12. The organic light emitting display device of claim 11, wherein the back-biasing voltage decreases as a threshold voltage of the emission control transistor decreases.

* * * * *